(12) United States Patent
Ponomarev et al.

(10) Patent No.: US 7,838,367 B2
(45) Date of Patent: Nov. 23, 2010

(54) METHOD FOR THE MANUFACTURE OF A SEMICONDUCTOR DEVICE AND A SEMICONDUCTOR DEVICE OBTAINED THROUGH IT

(75) Inventors: Youri Ponomarev, Leuven (BE); Josine Loo, Leuven (BE)

(73) Assignee: NXP B.V., Eindhoven (NL)

( * ) Notice: Subject to any disclaimer, the term of this patent is extended or adjusted under 35 U.S.C. 154(b) by 507 days.

(21) Appl. No.: 11/722,988

(22) PCT Filed: Dec. 19, 2005

(86) PCT No.: PCT/IB2005/054307

§ 371 (c)(1),
(2), (4) Date: Jun. 27, 2007

(87) PCT Pub. No.: WO2006/070310

PCT Pub. Date: Jul. 6, 2006

(65) Prior Publication Data

US 2008/0093668 A1     Apr. 24, 2008

(30) Foreign Application Priority Data

Dec. 28, 2004  (EP) .................................. 04107021

(51) Int. Cl.
H01L 21/336     (2006.01)
(52) U.S. Cl. ....................................................... 438/283
(58) Field of Classification Search ................ 438/277, 438/283
See application file for complete search history.

(56) References Cited

U.S. PATENT DOCUMENTS 6,043,535 A * 3/2000 Houston ..................... 257/345
6,335,214 B1 * 1/2002 Fung ........................... 438/30
6,346,446 B1   2/2002 Ritenour (Continued)

FOREIGN PATENT DOCUMENTS

JP     04307972 A  * 10/1992

(Continued)

*Primary Examiner*—Zandra Smith
*Assistant Examiner*—Grant S Withers

(57) ABSTRACT

The invention relates to a semiconductor device (10) having a semiconductor body (2), comprising a field effect transistor, a first gate dielectric (6A) being formed on a first surface at the location of the channel region (5) and on it a first gate electrode (7), a sunken ion implantation (20) being executed from the first side of the semiconductor body (2) through and on both sides of the first gate electrode (7), which implantation results in a change of property of the silicon below the first gate electrode (7) compared to the silicon on both sides of the gate electrode 7) in a section of the channel region (5) remote from the first gate dielectric (6A), and on the second surface of the semiconductor body (2) a cavity (30) being provided therein by means of selective etching while use is made of the change of property of the silicon. A second gate (6B,8) is deposited in the cavity thus formed. Before the ion implantation (20), a mask (M1) is formed on both sides of the gate electrode (7) and at a distance thereof, whereby after the ion implantation (20) at the location of the mask (M 1) also a change in property of the silicon is obtained. In this way the device (10) can be easily provided with lateral insulation regions. Also the end regions of the gate electrodes (7,8) can in this way be surrounded by insulation regions.

14 Claims, 10 Drawing Sheets

U.S. PATENT DOCUMENTS

Figure 1:
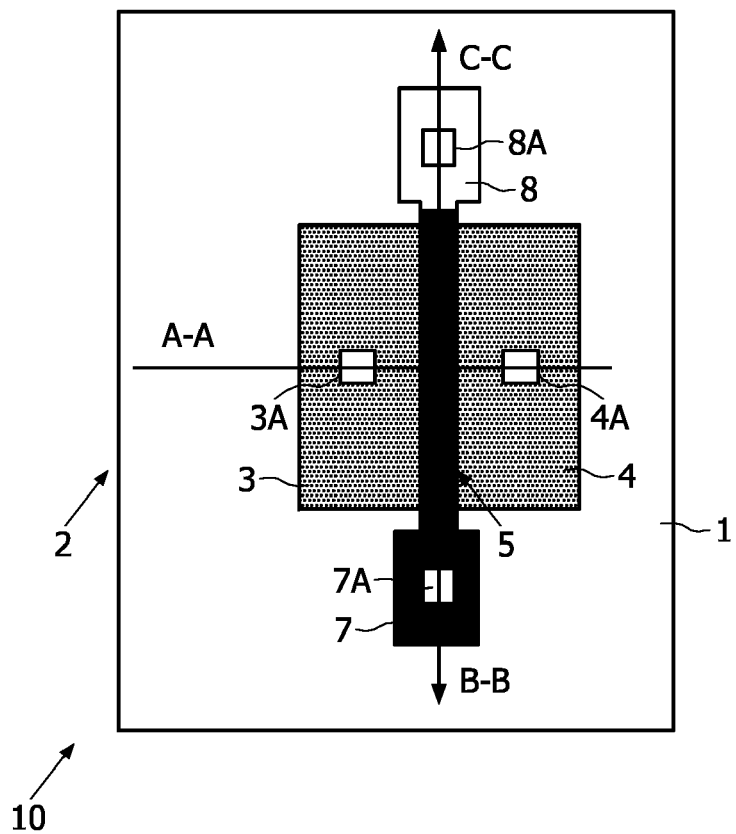
Figure 2A:
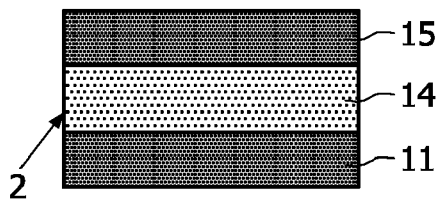
Figure 2B:
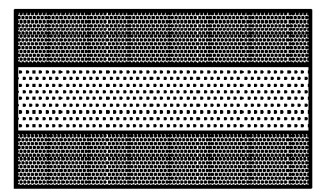
Figure 2C:
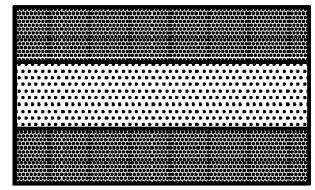

| | | | |
|---|---|---|---|
| 6,413,802 B1 | 7/2002 | Hu et al. | |
| 6,621,124 B2 | 9/2003 | Ponomarev | |
| 6,642,090 B1 | 11/2003 | Fried et al. | |
| 7,253,033 B2 * | 8/2007 | Komatsu | 438/149 |
| 7,253,060 B2 * | 8/2007 | Yun et al. | 438/284 |
| 7,312,126 B2 * | 12/2007 | Ilicali et al. | 438/283 |
| 7,485,510 B2 * | 2/2009 | Zhu et al. | 438/157 |
| 7,521,323 B2 * | 4/2009 | Surdeanu et al. | 438/283 |
| 7,556,995 B2 * | 7/2009 | Coronel et al. | 438/197 |
| 7,659,169 B2 * | 2/2010 | Surdeanu et al. | 438/283 |
| 7,670,912 B2 * | 3/2010 | Yeo et al. | 438/283 |
| 7,671,418 B2 * | 3/2010 | Topaloglu | 257/365 |
| 7,709,332 B2 * | 5/2010 | Licitra et al. | 438/283 |
| 7,745,299 B2 * | 6/2010 | Yun | 438/305 |
| 2002/0090758 A1 | 7/2002 | Henley et al. | |
| 2003/0111686 A1 * | 6/2003 | Nowak | 257/328 |
| 2004/0121531 A1 * | 6/2004 | Wieczorek et al. | 438/197 |
| 2004/0192055 A1 * | 9/2004 | Weber et al. | 438/705 |
| 2004/0222471 A1 | 11/2004 | Inoh | |
| 2006/0022264 A1 * | 2/2006 | Mathew et al. | 257/331 |
| 2006/0022275 A1 * | 2/2006 | Ilicali et al. | 257/366 |
| 2006/0240622 A1 * | 10/2006 | Lee et al. | 438/257 |
| 2007/0232003 A1 * | 10/2007 | Loo et al. | 438/283 |
| 2008/0194069 A1 * | 8/2008 | Surdeanu et al. | 438/283 |
| 2008/0246090 A1 * | 10/2008 | Dokumaci et al. | 257/347 |

FOREIGN PATENT DOCUMENTS

| | | |
|---|---|---|
| WO | WO2005022648 A1 | 3/2005 |

* cited by examiner

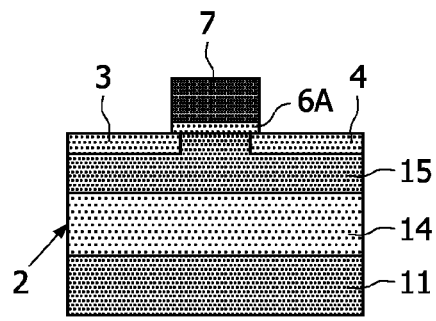
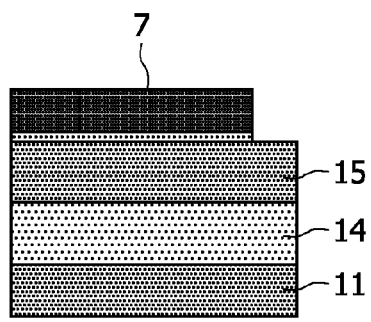
FIG. 3a  FIG. 3b
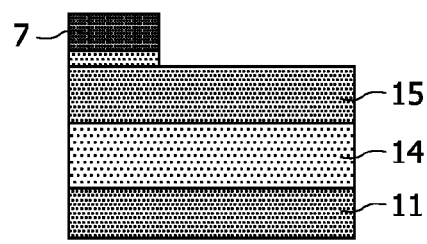
FIG. 3c
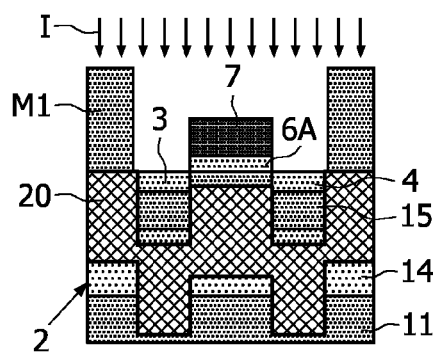
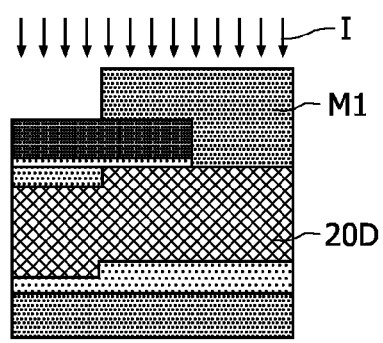
FIG. 4a  FIG. 4b
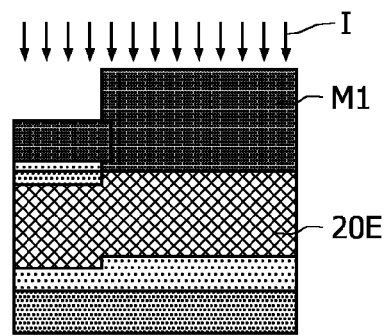
FIG. 4c

METHOD FOR THE MANUFACTURE OF A SEMICONDUCTOR DEVICE AND A SEMICONDUCTOR DEVICE OBTAINED THROUGH IT

The invention relates to a method for the manufacture of a semiconductor device having a substrate and a silicon semiconductor body with a first surface and a second surface facing away from it, and comprising a field effect transistor with a source region, a drain region and an intermediate channel region, a first gate dielectric being formed on the first surface at the location of the channel region and on it a first gate electrode on both sides of which the source region and the drain region are formed, a sunken ion implantation being executed from the first surface of the semiconductor body through and beside the first gate electrode, which implantation results in a change of property of the silicon below the first gate electrode compared to the silicon on both sides of the first gate electrode in a section of the channel region remote from the first gate dielectric, and on the second surface of the semiconductor body a cavity being provided therein by means of selective etching while use is made of the change of property of the silicon, subsequent to which a second gate dielectric is deposited in the cavity thus formed and a second gate electrode is formed on top of it.

Such a method is pre-eminently suitable for the manufacture of field effect transistors, more particularly in CMOS technology (=Complementary Metal Oxide Semiconductor) in the (sub) 32 nm domain. As a result of the presence of an additional gate electrode in such a transistor, electrostatic control of the channel load carriers has considerably improved, so that the risk of what are called short-channel effects is reduced. Effects of this kind have an extremely disadvantageous effect on various relevant transistor properties.

A method of this kind is known from U.S. Pat. No. 6,621, 124 B2 published on Sep. 16, 2003. It describes how a field effect transistor is manufactured by forming a gate electrode on a silicon surface of a semiconductor body and executing through this gate electrode a sunken ion implantation of doting atoms. The profile of the implanted ions is such that they are located below the gate electrode at a small distance from the surface of the semiconductor body, so that proper operation of the channel region of the transistor to be formed remains possible. On both sides of the gate electrode the implanted profile is situated completely in an electrically insulating silicon dioxide layer located below the silicon semiconductor body, which layer is located on a (temporary) substrate. After a substrate transfer process this substrate is removed as is the electrically insulating layer. Subsequently, the semiconductor body is oxidized by means of a thermal oxidation. During this operation the fact is used that at places where there is the implanted profile, the doting concentration in the semiconductor body is much higher than beside it, so that at these spots a thicker oxidized region is formed because a higher doting concentration is accompanied with a higher oxidation rate. The oxide formed during the (thermal) oxidation is then removed by means of etching, so that a cavity is provided in an opposite surface of the semiconductor body. A gate dielectric and a second gate electrode are deposited in this cavity. Thanks to the method according to the invention this second gate electrode is aligned relative to the first gate electrode in a self-registering manner.

A disadvantage of the known method is that it is highly suitable for the manufacture of ICs (=Integrated Circuits) because the transistors obtained with it do not have a mutually electrical insulation.

It is an object of the present invention to provide a method that does not present said drawback or only to a lesser extent and by means of which field effect transistors are obtained that have a mutual insulation, that is relatively simple and can be applied well in a CMOS domain having extremely small dimensions.

For this purpose a method of the type defined in the opening paragraph is characterized in accordance with the invention in that a mask is provided on both sides of the gate electrode and at a distance therefrom prior to the ion implantation being executed on the first surface, as a result of which also a change of property of the silicon is obtained at the location of the mask in the semiconductor body after the ion implantation. By introducing an additional mask at the stage prior to the ion implantation through the first gate electrode, there is achieved that the property of the silicon at some distance from the first gate electrode is changed too. These regions, which are thus located on both sides of the source region and the drain region, can advantageously be used for the formation of the desired insulation regions. A suitable choice of the thickness of the mask provides that it can be manufactured such that locally the entire thickness of the semiconductor body has a modified property. Subsequently, insulating regions can thus easily and selectively be formed at these spots, which regions form electrical insulators for the individual transistors. This can be effected simultaneously and identically with the formation of the cavity. If the cavity is formed by means of thermal oxidation, the oxidized regions that have been formed at a distance from the cavity to be formed can be covered by an extra mask prior to the cavity being formed by means of etching. This extra mask can also be used for the formation of the gate electrode in the cavity as will become apparent hereinafter.

In a preferred embodiment, prior to the cavity being provided in the second (opposite) surface, a further mask is deposited on this second surface (seen in projection) at the spot of (the location of) the mask, which further mask is removed again after the second gate electrode has been formed in the cavity, after which, opposite the location of the mask, further cavities are provided in the semiconductor body by means of selective etching, implementing the change of property of the silicon. This embodiment is specifically advantageous if the cavity is not formed by means of thermal oxidation, but exclusively by an etching step. This is the case if the crystallinity of the silicon is chosen as the silicon property that is modified by the implantation. The recognition then plays a role that for example amorphous silicon can be selectively etched compared to polycrystalline silicon. In this variant the further cavities—after their formation—are preferably filled with an electrically insulating layer. In this way the desired electrically insulating regions are obtained in a simple manner.

In an advantageous embodiment the first and second gate electrodes are formed such that in longitudinal direction seen in projection they have each a non-overlapping part. This makes possible to reach both gate electrodes from one side of the embodiment, without the need to pass by the other for this purpose. It should be observed in this respect that longitudinal direction is here to be understood to mean the geometrical longitudinal direction. For the transistor this is the transverse direction of the channel region.

In an advantageous variant the mask is formed such that at the location of the non-overlapping part of the first and second gate electrodes and beyond this, also a change of property of the silicon is obtained in the semiconductor body. This phenomenon can be advantageously made use of to remove the semiconductor body at the location of the non-overlapping parts of the gate electrodes. Said parts may then be easily enveloped in an electrically insulating layer. The further mask is then also preferably used for removing a part of the semiconductor body at the location of the non-overlapping region of the first and second gate electrodes and beyond this before the second gate electrode is deposited and the remaining part of the semiconductor body is then removed there after the second gate electrode has been deposited.

Preferably the crystallinity is chosen as the property of the silicon and etching is carried out with an etching agent with which silicon having a lower degree of crystallinity can be selectively etched with respect to silicon having a higher degree of crystallinity. In this way amorphous or polycrystalline silicon can be selectively etched with respect to monocrystalline silicon. For etching amorphous silicon with respect to monocrystalline, for example a wet etching agent has appeared to be suitable which is based on hydrogen fluoride or phosphoric acid to which oxygen has been added, for example as a gas or as a compound from which oxygen can be released, such as hydrogen peroxide.

Preferably non-doting ions are chosen for the ion implantation. They make possible, on the one hand, with a suitable dose and/or implantation energy, to render monocrystalline silicon amorphous in a simple way, on the other hand, these atoms do not affect or not substantially affect—insofar as they end up outside the amorphous regions—the electrical and semiconductor properties of monocrystalline silicon. Ions that have proved to be suitable are for example Argon ions.

As has already been observed above, rendering silicon (locally) amorphous is highly suitable for a method according to the invention. In an advantageous variant, after the ion implantation, the amorphous silicon for its etching is partially recrystallised by means of an annealing step. As a result, particularly the further cavities can be provided to have smaller dimensions, particularly smaller lateral dimensions if the amorphous regions are formed from an electrically insulating layer such as a silicon dioxide layer. After all, such a recrystallisation starts from the boundary surface between the amorphous silicon and the boundary monocrystalline part of the silicon semiconductor body. This makes the—particularly lateral—dimensions of the amorphous regions smaller and, consequently, the corresponding dimensions of the cavities/further cavity provided at these spots.

In a method according to the invention the semiconductor body is preferably formed on an electrically insulating layer deposited on a further substrate and after the formation of the first gate electrode and after the sunken ion implantation has been executed on the side of the first gate electrode, the substrate is deposited after which the further substrate is removed. Such a process of substrate transfer is highly suitable for obtaining the desired results. The starting point is then formed by an SOI (Silicon On Insulator) structure. On one and the same side of the device preferably the non-overlapping parts of the gate electrodes are provided with an electrical connector.

An embodiment of the invention relates to semiconductor device obtained by implementing the above-described method.

The invention will now be elucidated with reference to an example of embodiment and the drawing in which:

FIG. 1 shows schematically and in plan view an embodiment of a semiconductor device obtained by implementing a method according to the invention, and FIGS. 2 to 12 show schematically and in a cross sectional view perpendicular to the thickness direction the device of FIG. 1 in consecutive stages of the manufacture by means of an implementation of a method according to the invention.

The figures are not drawn to scale and some dimensions are represented in an exaggerated way for clarity. Corresponding regions or component parts have as much as possible the same hatching and the same reference numerals.

FIG. 1 shows schematically and in plan view an embodiment of a semiconductor device obtained by means of a method according to the invention. The device 10 of this example comprises (see FIG. 1) a substrate 1, in this case of p-type silicon, which is covered with an electrically insulating layer 14, in this case of silicon dioxide and on top of this a semiconductor body 2. This body 2 has in this case an n-type source region 3 with a connection region 3A and an also n-type drain region 4 with a connection region 4A and a p-type channel region 5 in between. The p-type channel region is located between two gate electrodes 7,8 with the gate electrode 8 being located above this region and the gate electrode 7 below this region. The two gate electrodes 7,8 have in their longitudinal-direction end regions (i.e. the transverse direction of the transistor) non-overlapping parts which have further connection regions 7A,8A. All connection regions 3A,4A,7A,8A are connected on one side of the device 10 (the upper side in FIG. 1) to a conductor pattern (not shown in the drawing) which is located on the surface of the device 10 and is separated from the (parts of the) field effect transistor by means of an electrically insulating layer. Due to the presence of the two gate electrodes 7,8 it is possible to have very good electrostatic control of the load carriers in the channel of the field effect transistor, so that what are called short-channel effects are avoided and the transistor has eminent properties even if the lateral dimensions of the channel region 5 are extremely small, for example of the order of several dozen nm. Further details of the device 10 of this example will be discussed hereinafter during the discussion of the manufacture of the device 10 by means of an embodiment of a method according to the invention.

FIGS. 2 to 12 show schematically and in a cross sectional view perpendicular to the thickness direction of FIG. 1 in successive stages of manufacture by means of an embodiment of a method according to the invention. Fig. a then always shows a cross section along the line AA in FIG. 1, whereas the Figs. b and c always show a cross section along the lines BB and CC respectively in FIG. 1. A p-type silicon substrate 11 (see FIG. 2) is started from with on top of this an electrically insulating silicon dioxide layer 14 and on top of this a p-type silicon semiconductor region 15. In this example this structure is realized by executing an oxygen implantation in a p-type substrate so that SOI (Silicon On Insulator) structure arises as described above. However, the structure may also be obtained in a different manner like with the aid of a substrate transfer process based on an oxidized silicon substrate on which a further silicon substrate is deposited whose thickness is subsequently reduced.

Then (FIG. 3) a first gate dielectric 6A is formed with on it a first gate electrode 7. This is effected by a thermal oxidation of the semiconductor region 15 and by depositing a conductive or semiconductive layer on it and by forming the strip-like pattern of the first gate electrode 7 by means of photo lithography and etching. Subsequently, the source region 3 and the drain region 4 are formed here, both of the n-conductor type by means of, for example, an ion implantation. These regions 3,4 can comprise not only a thinner, lower doted part but also a thicker and higher doted part. What are called spacers may then be used on both sides of the gate electrode 7, which is here 5 to 100 nm wide (geometrically) and is 5 to 10 times this value long (geometrically).

Then (see FIG. 4) a first mask M1, for example of photoresist and having a suitable thickness, is applied at a distance from 5 to 150 nm from the first gate electrode 7.

Subsequently, the device 10 is bombarded with an ion implantation I of Argon ions and with a flux of $3 \times 10^{14}$ at/cm$^2$ and at an energy level of 150 keV. These conditions are such that a sunken ion implantation profile 20 is formed in the device 10. At the location of the mask M1 the semiconductor region 15 has been made amorphous over its entire thickness and at the location of the gate electrode 7 this holds for a region located at a small distance from the gate dielectric 6A. In the end regions of the gate electrodes 7,8 the mask M1 is positioned such that amorphous silicon parts 20D,20E are formed there also. The position of M1 is then chosen such that with the formation of the second gate electrode 8, which will be discussed hereinafter, the end regions of the two gate electrodes 7,8 are formed such that they do not have overlapping parts. This in view of easily making contact with the two gate electrodes 7,8 from the side of the device 10. See FIGS. 4b and 4c.

Figure 5A:
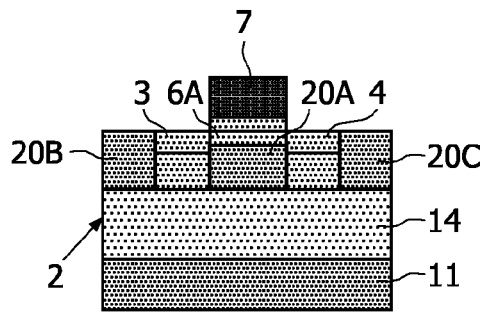
Figure 5B:
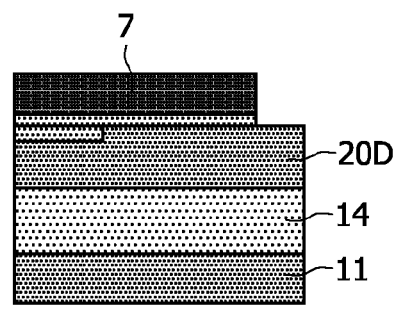
Figure 5C:
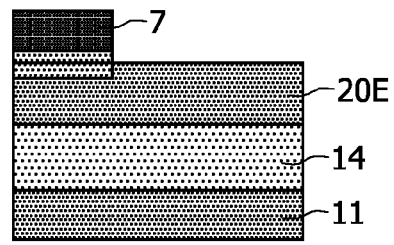
Figure 6A:
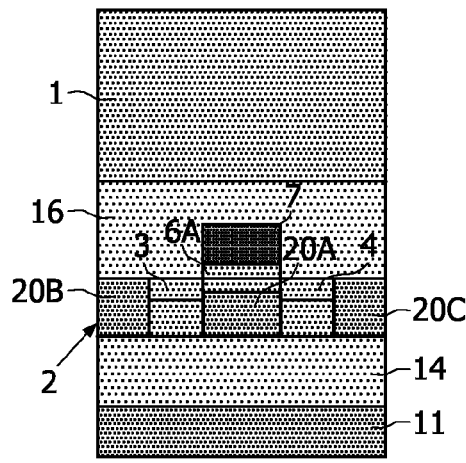
Figure 6B:
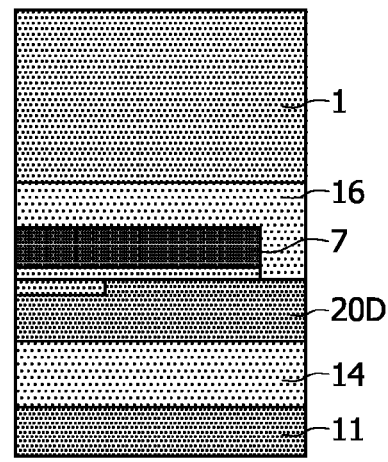
Figure 6C:
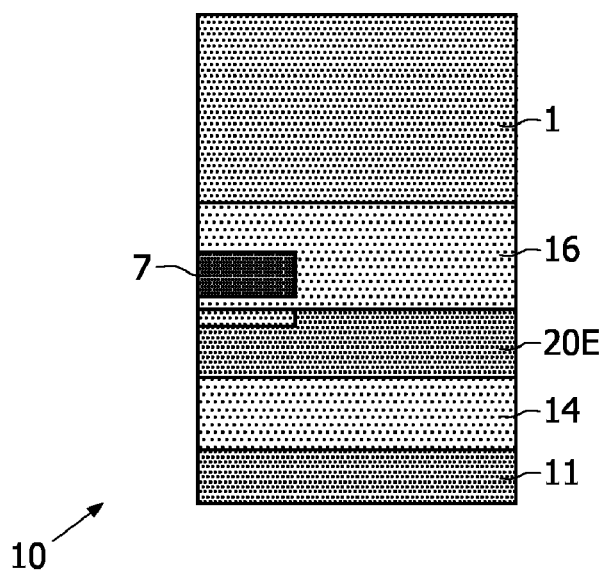

FIG. 5 shows this stage of the device 10, after removal of the mask M1. The relevant amorphous regions are referred to here as 20A,20B and 20C. The parts of the implantation/amorphisation profile 20 located in the substrate 11 and the insulating layer 14 have been omitted here as they are not relevant.

Figure 7A:
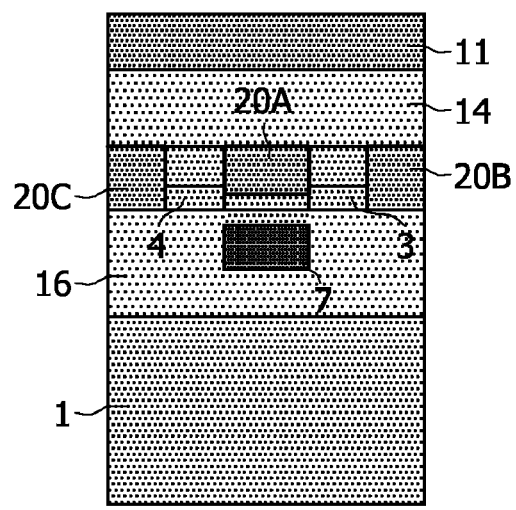
Figure 7B:
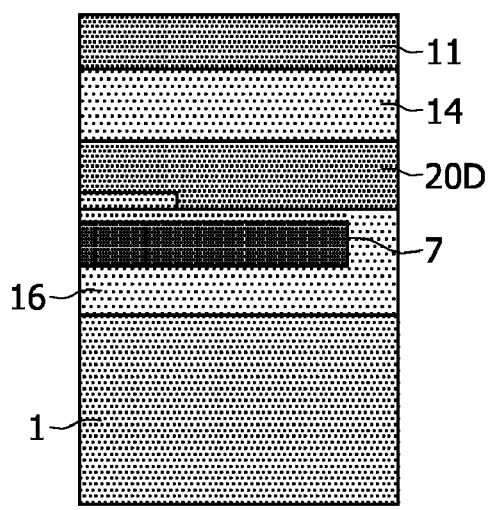
Figure 7C:
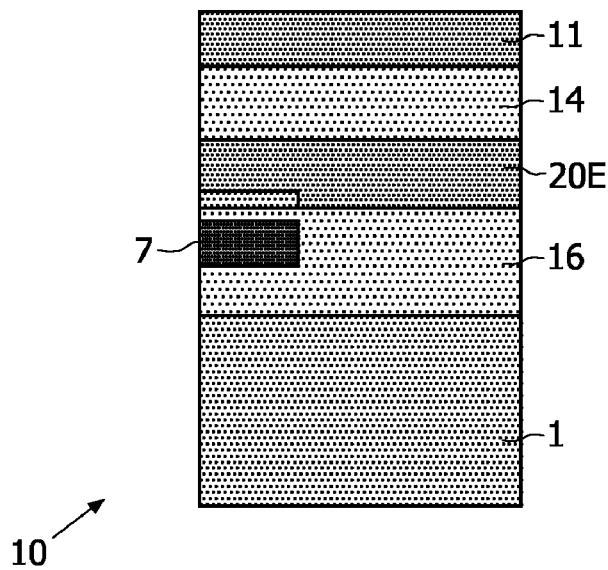
Figures 8A, 8B:
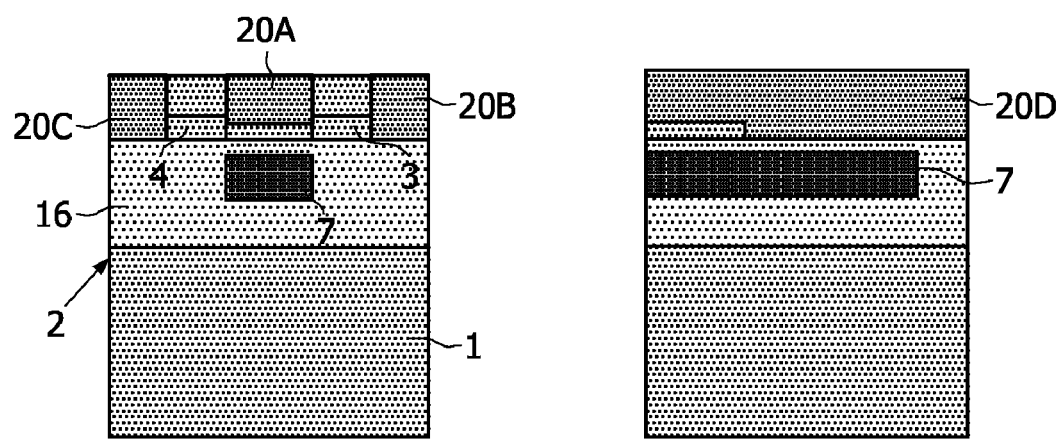
Figure 8C:
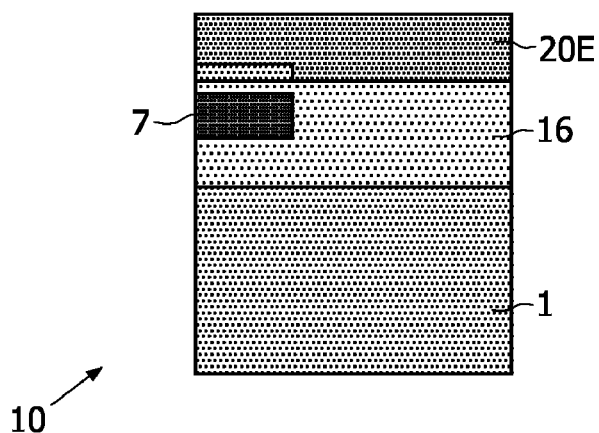
Figures 9A, 9B:
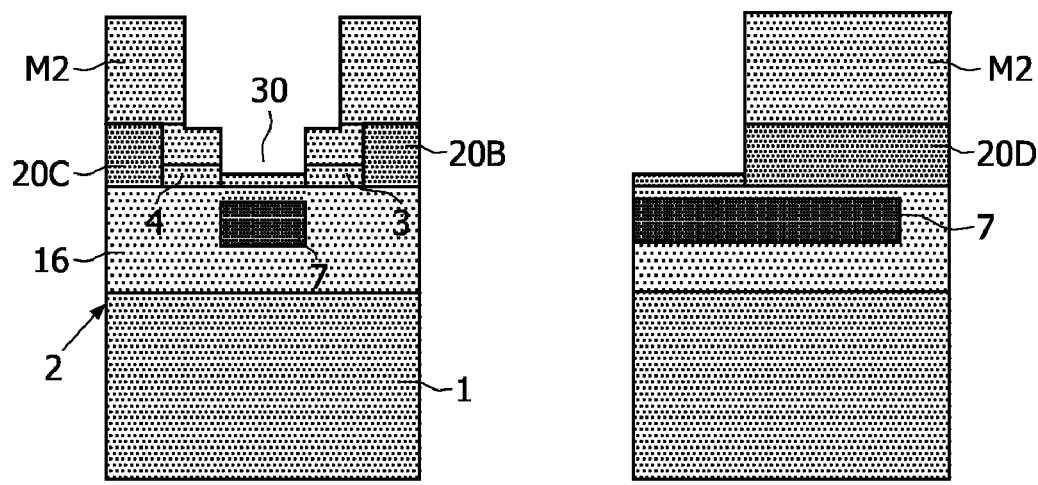
Figure 9C:
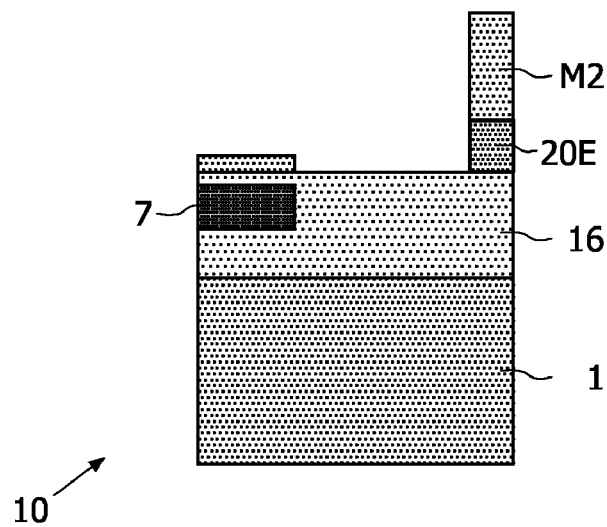
Figures 10A, 10B:
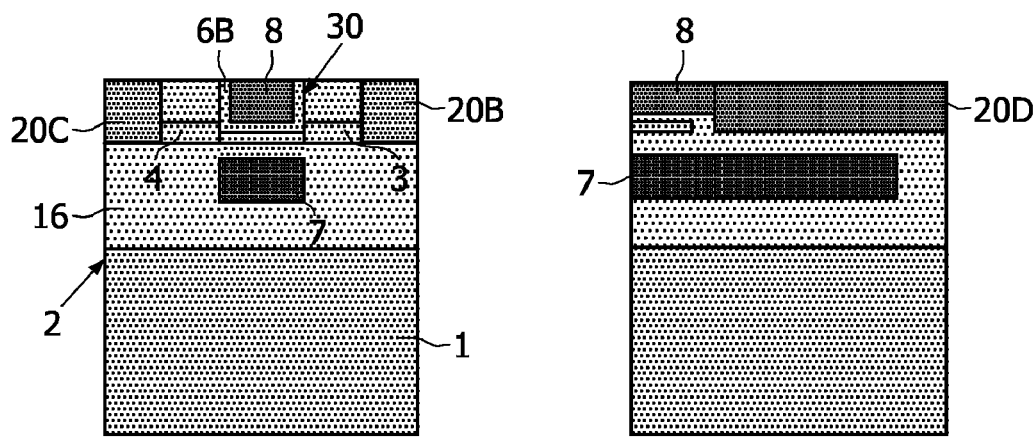
Figure 10C:
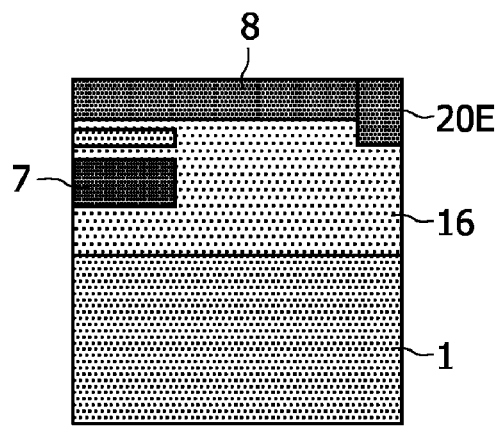
Figure 11A:
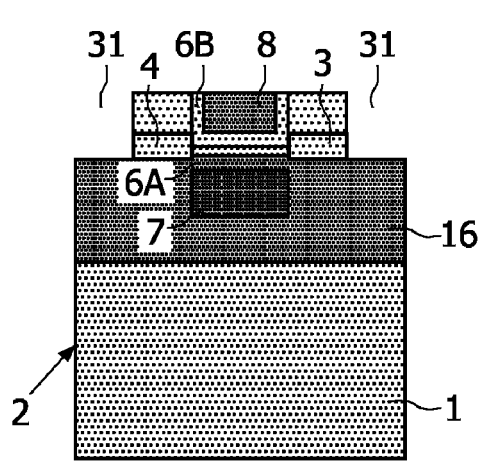
Figure 11B:
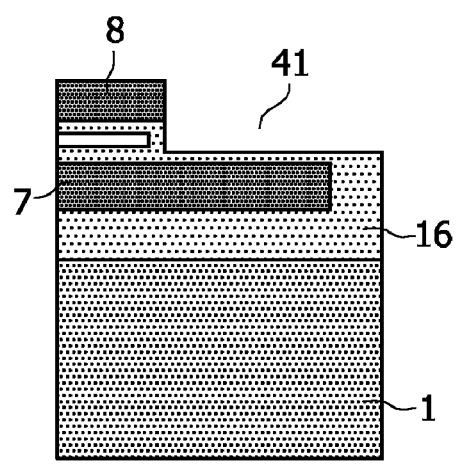
Figure 11C:
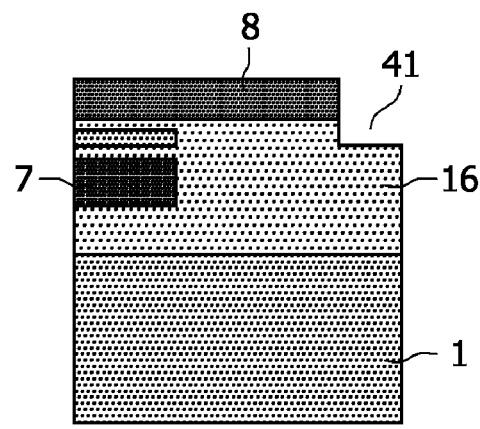
Figure 12A:
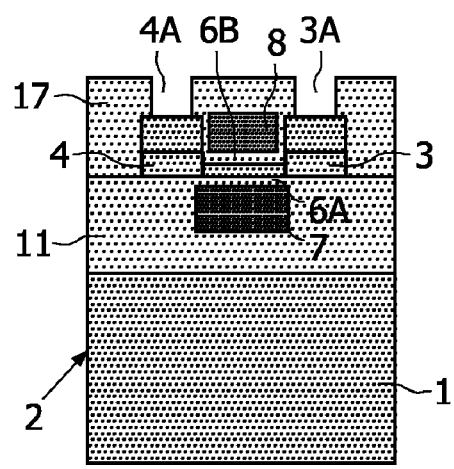
Figure 12B:
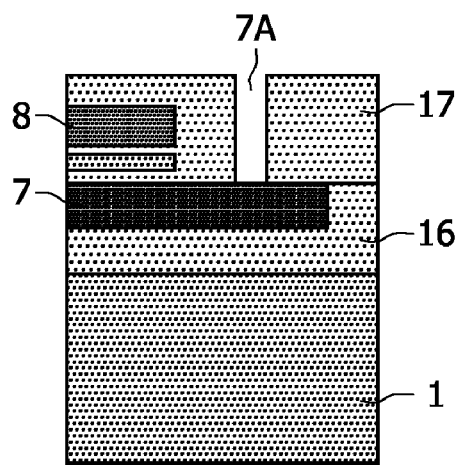
Figure 12C:
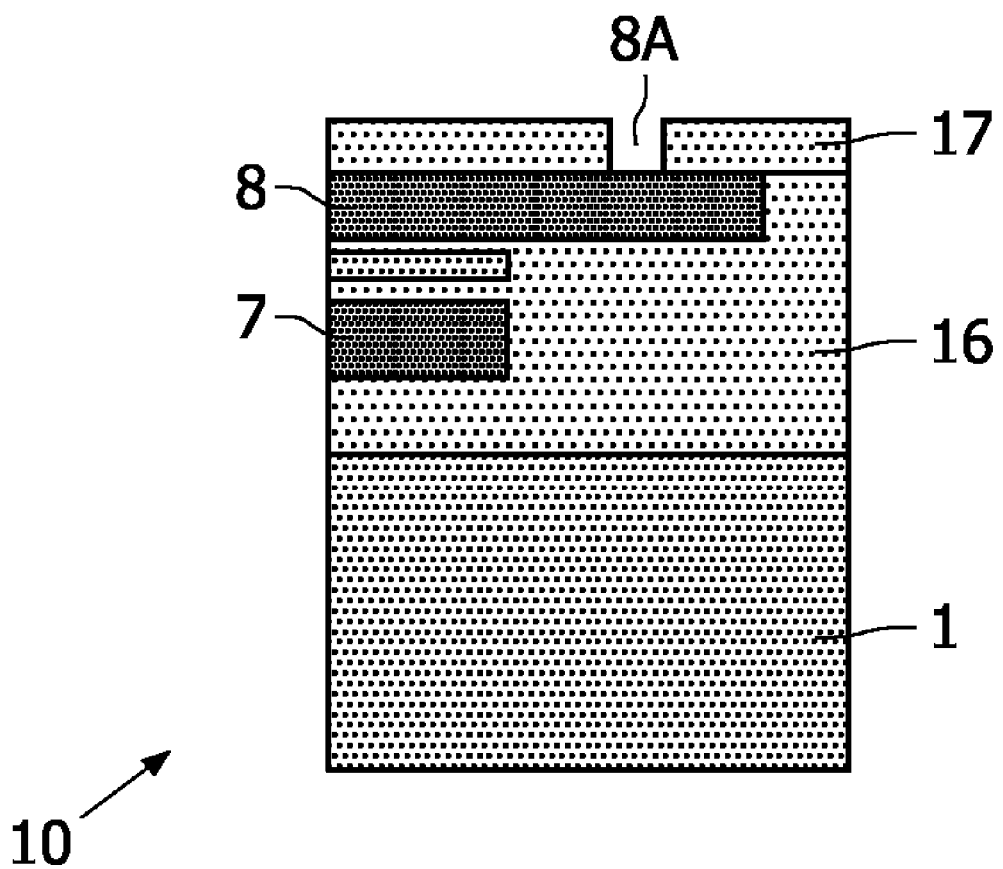

An electrically insulating layer 16 of silicon dioxide is then formed via the gate electrode 7 (see FIG. 6), here by means of CVD (Chemical Vapour Deposition). A further p-type silicon substrate 1 is then deposited on the layer for the benefit of a substrate transfer process. This result may also be achieved by forming an insulating layer 16 on a silicon substrate 1, for example by means of a thermal oxidation and applying this region to the first gate electrode 7. The situation of having turned the device 10 through a 180-degree angle in the plane of the drawing is shown in FIG. 7.

Subsequently, (see FIG. 8) the substrate 11 is removed, for example by implementing CMP, or etching or a combination of the two. Similarly holds for the insulating layer 14 which can be etched for example by means of an aqueous HF solution.

Subsequently, (see FIG. 9) a second mask layer M2 is formed, for example of photoresist, which is patterned by means of photolithography. The mask layer M2 is provided with (rectangular) cavities which are aligned to the strip-like gate electrode 7 and whose width includes also part of the source and drain regions 3,4. Then a first amorphous silicon part 20A is removed from the semiconductor body 2 by means of etching, so that a cavity 30 is made in the semiconductor body 2. Etching is done with an etching agent that is selective with respect to monocrystalline silicon 15 and can be done, for example, with an etching agent based on hydrogen fluoride or phosphoric acid, to which oxygen has been added. In the end regions of the gate electrodes 7,8 the mask M2 is positioned such that the amorphous parts 20D,20E are also partly removed. See FIGS. 9b and 9c.

Subsequently (see FIG. 10), once the second mask pattern M2 has been removed, the surface of the semiconductor body 2 is provided with a second gate dielectric 6B and a second gate electrode 8 which are both located in the cavity 30 thus formed. This may be effected, for example, by thermally oxidizing the surface and depositing a conductive or semiconductive layer such as metal or polycrystalline silicon for example by means of CVD and then planarizing the device 10 for example by means of CMP. At this stage the second gate electrode 8 in the end regions of the two gate electrodes 7,8 is formed and positioned such that the two gate electrodes 7,8 have parts there that do not overlap. See FIGS. 10b and 10c.

Subsequently (see FIG. 11), the amorphous silicon parts 20B,20C are removed by means of an etching process in a similar fashion to previously the amorphous silicon part 20A. During this process further cavities 31 are made in the surface of the semiconductor body 2. At the same time the (remaining portions of the) amorphous parts 20D,20E are removed from the end regions of the gate electrodes 7,8 while other cavities 41 are made at these spots. See FIGS. 11b and 11c.

Subsequently (see FIG. 12), a dielectric layer for example a silicon dioxide layer 17 deposited by means of CVD is applied covering the device 10 while the further cavities 31 and other cavities 41 are filled and electrical insulation regions are formed locally. This is followed by a planarization step, for example a CMP step. Contact openings 4A,3A are then provided in the thus planarized dielectric layer 17 by means of photolithography and etching. A conductor such as aluminium is then disposed in these cavities, which conductor forms part of a surface-cladding conductor pattern by which the source and drain regions 3,4 are connected electrically. At the same time (see FIGS. 12b and 12c) other contact cavities 7A,8A are formed and filled with part of the conductor pattern, integrated circuit for the electrical connection of the two gate electrodes 7,8. Individual devices 10 may be obtained by utilizing a separate technique such as sawing or etching.

The invention is not restricted to the examples of embodiment given, since within the scope of the invention many variants and modifications are possible for a man of ordinary skill in the art. For example, the invention may also be applied not only to a CMOS but also to a Bi(C)MOS (Bipolar (Complementary) Metal Oxide Semiconductor) IC (Integrated Circuit). The invention can be applied to both P and NMOS transistors.

It is observed that the structure of the device may be periodic in one or more directions and that lay-out tools may generally be used.

Also for a method according to the invention it holds that many variants and modifications are possible. For example other deposition techniques may be used and different materials selected than those from the example.

The invention claimed is:

1. A method for the manufacture of a semiconductor device, the method comprising:
   providing a substrate;
   forming a first gate dielectric on a first surface of a silicon semiconductor body on the substrate;
   forming a first gate electrode on the first gate dielectric;
   forming a source region of a field effect transistor and a drain region of the field effect transistor on both sides of the first gate electrode;
   providing a mask on both sides of the first gate electrode;
   after providing the mask on both sides of the first gate electrode, executing an ion implantation from the first surface of the semiconductor body completely through and beside the first gate electrode;
   making a cavity on a second surface of the semiconductor body, wherein the first surface is positioned between the second surface and the substrate;
   depositing a second gate dielectric in the cavity; and
   forming a second gate electrode on top of the second gate dielectric.

2. A method as claimed in claim 1 further comprising:
   prior to making the cavity on the second surface of the semiconductor body, depositing a further mask on the second surface of the semiconductor body;
   removing the further mask; and after removing the further mask, making further cavities in the semiconductor body.

3. A method as claimed in claim 2 further comprising filling the further cavities with an electrically insulating layer.

4. A method as claimed in claim 1, characterized in that the first and second gate electrodes are formed such that in longitudinal direction seen in projection the first and second gate electrodes have each a non-overlapping part.

5. A method as claimed in claim 1 further comprising prior to making the cavity on the second surface of the semiconductor body, depositing a further mask on the second surface of the semiconductor body.

6. A method as claimed in claim 4 further comprising:
prior to forming the second gate electrode, removing a part of the semiconductor body at the location of the non-overlapping parts of the first and second gate electrodes using the further mask; and
after forming the second gate electrode, removing the remaining part of the semiconductor body.

7. A method as claimed in claim 1, wherein making the cavity on the second surface of the semiconductor body comprises etching the semiconductor body selectively with respect to silicon crystallinity.

8. A method as claimed in claim 7, wherein etching the semiconductor body comprises etching the semiconductor body with a wet-chemical etching agent based on hydrogen fluoride or phosphoric acid with oxygen.

9. A method as claimed in claim 1, wherein executing the ion implantation from the first surface of the semiconductor body through and beside the first gate electrode comprises executing the ion implantation with non-doping ions from the first surface of the semiconductor body through and beside the first gate electrode.

10. A method as claimed in claim 1, wherein executing the ion implantation with non-doping ions from the first surface of the semiconductor body through and beside the first gate electrode comprising executing the ion implantation with argon ions from the first surface of the semiconductor body through and beside the first gate electrode.

11. A method as claimed in claim 1, characterized in that silicon at the location of the mask is locally made amorphous by executing the ion implantation.

12. A method as claimed in claim 11 further comprising annealing the amorphous silicon at the location of the mask to partially recrystallize the amorphous silicon.

13. A method as claimed in claim 1 further comprising after forming the first gate electrode, providing a further substrate and an electrically insulating layer to the semiconductor body, wherein the first gate electrode is positioned between the substrate and the further substrate.

14. A method as claimed in claim 1 further comprising providing an electrical connector to the non-overlapping parts of the first and second gate electrodes.

* * * * *